United States Patent [19]
Crowley

[11] Patent Number: 5,963,432
[45] Date of Patent: Oct. 5, 1999

[54] STANDOFF WITH KEYHOLE MOUNT FOR STACKING PRINTED CIRCUIT BOARDS

[75] Inventor: Christopher Thomas Crowley, Golden, Colo.

[73] Assignee: Datex-Ohmeda, Inc., Louisville, Colo.

[21] Appl. No.: 08/800,315

[22] Filed: Feb. 14, 1997

[51] Int. Cl.[6] .............. H05K 1/11; H01R 9/09; H01R 9/16
[52] U.S. Cl. ............. 361/804; 24/453; 174/138 G; 174/166 S; 361/744; 361/790; 403/408.1; 411/509; 411/510
[58] Field of Search ................. 174/138 D, 138 G, 174/138 R, 156, 157, 158 R, 166 R, 166 S; 248/27.3, 73, 221.12, 239, 224.8; 361/742, 744, 784, 803, 804, 790; 439/74, 95, 65, 75, 92, 567, 571; 403/408.1, 168; 411/57, 173, 34, 177, 508, 509, 55, 510, 182, 45, 32; 24/453, 458

[56] References Cited

U.S. PATENT DOCUMENTS

| | | | |
|---|---|---|---|
| D. 278,143 | 3/1985 | Hill | D13/99 |
| D. 278,330 | 4/1985 | Hill | D13/24 |
| D. 291,278 | 8/1987 | Hill | D8/354 |
| 3,880,486 | 4/1975 | Avakian | 361/744 |
| 4,640,639 | 2/1987 | Matsui | 174/138 D |
| 4,760,495 | 7/1988 | Till | 361/804 |
| 4,855,873 | 8/1989 | Bhargava et al. | 361/424 |
| 4,969,065 | 11/1990 | Petri | 361/804 |
| 4,970,761 | 11/1990 | Nakamura | 174/138 D |
| 5,018,982 | 5/1991 | Speraw et al. | 174/138 D |
| 5,263,247 | 11/1993 | Adachi et al. | 411/34 |
| 5,281,149 | 1/1994 | Petri | 439/66 |
| 5,345,366 | 9/1994 | Cheng et al. | 174/166 S |
| 5,460,543 | 10/1995 | Kosmala | 439/567 |

FOREIGN PATENT DOCUMENTS

| | | | |
|---|---|---|---|
| 2551508 | 3/1985 | France | 174/138 D |
| 2457228 | 6/1976 | Germany | 174/138 D |
| 3539361 | 5/1987 | Germany | 174/138 D |
| 52-142650 | 4/1951 | Japan | 174/138 D |
| 766052 | 9/1980 | Russian Federation | 174/138 D |

OTHER PUBLICATIONS

IBM Technical Disclosure Bulletin "Three–level Fastener" by B. L. Wilzbzch vol. 18 No. 6; p. 1735, Nov. 1975.
RICHO Catalog pp. RSS–02, RSS–05 and RSS–08 RICHCO, 5825 N. Tripp Ave., Chicago, IL 60646.
Hartwell Commercial Division, 950 S. Richfield Rd., Placentia, CA 92670 page entitled NYLATCH Standoff, HNST 4 Series.
Precision Metal Products Co. (PMP) Centennial Drive, Peabody, MA 01960 Catalog p. 10.
(PEM) Penn Engineering & Manufacturing Corp., Danboro, PA 18916 Data sheet "Let PEM® self–clinching fasteners be your edge over competition".
Penn Engineering & Manufacturing Corp., Data sheet "Self–Clinching Standoffs".

*Primary Examiner*—Donald Sparks
*Attorney, Agent, or Firm*—Holme Roberts & Owen LLP

[57] ABSTRACT

A standoff for mounting two or more printed circuit boards to a chassis in which one keyhole cut printed circuit board may be slidably mounted on the keyhole mount of the standoff and a second printed circuit board may be mounted on the top portion of the standoff spaced away from the first printed circuit board. The second printed circuit board may be affixed to the standoff by either a screw mount, snap lock mount, adhesive, bolt and nut, clamp or other method.

4 Claims, 3 Drawing Sheets

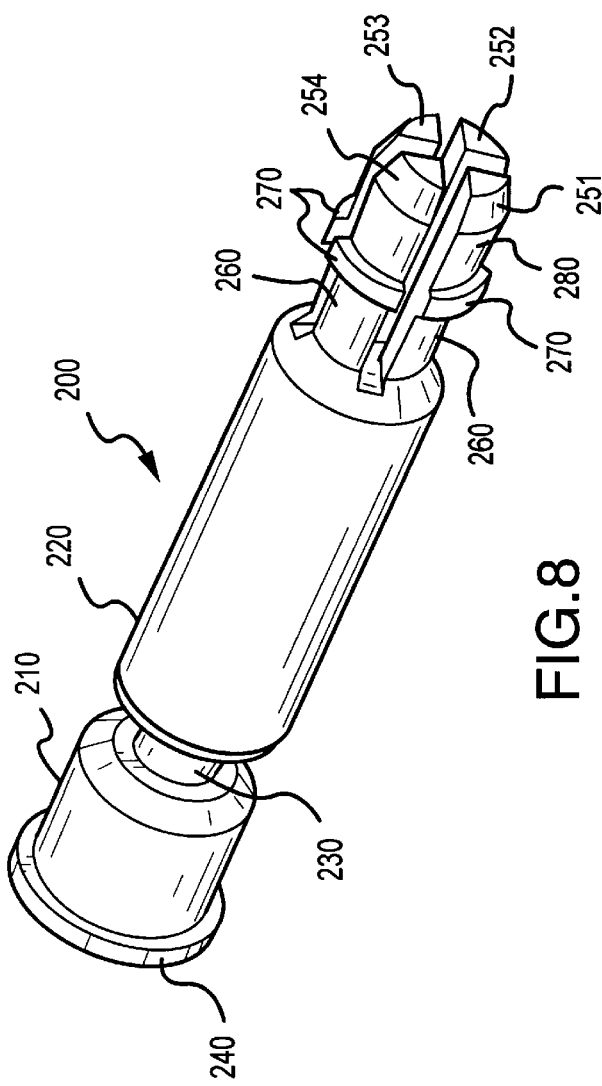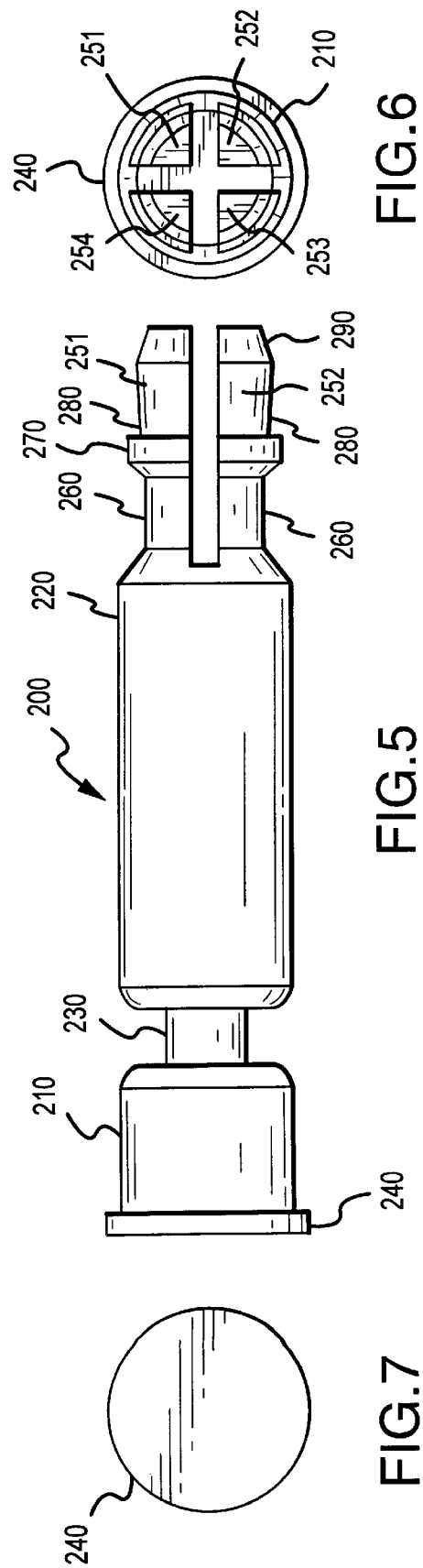

STANDOFF WITH KEYHOLE MOUNT FOR STACKING PRINTED CIRCUIT BOARDS

BACKGROUND OF THE INVENTION

The present invention generally concerns the manufacture of electronic instruments having a plurality of printed circuit boards mounted therein. During the manufacture of electronic instruments, such as photoplethysmographic monitors, one or more printed circuit boards containing circuitry and various electronic components must be mounted on a chassis which is one part of the housing of the instrument. The standoff is a small often cylindrical part used to separate printed circuit boards from the chassis.

One of the problems associated with electronic instrument manufacture is the manufacture of an instrument which contains a plurality of printed circuit boards or other electronics boards, particularly those having one or more elements, such as input/output ports, which extend through the back plane of the chassis or housing. During the manufacture of such an instrument the printed circuit board cannot simply be lowered into the chassis from above in the same position in which it will be affixed to one or more standoffs. Rather, it is necessary to slide the printed circuit board in the plane of the printed circuit board so as to align the elements which extend through the back plane of the chassis or housing with their respective openings.

Therefore, there exists a need for a printed circuit board standoff which will facilitate the alignment and affixation of one or more printed circuit boards to a chassis. Prior art standoffs include those which are designed for the affixation of one printed circuit board through the use of internal threads which are mated to a screw which extends through the plane of the printed circuit board. Also known in the prior art are printed circuit board standoffs which use a keyhole to permit the mounting of a printed circuit board in a sliding manner. Additionally, prior art standoffs have included standoffs which use a friction fit such as the SNAP-TOP® from Penn Engineering and Manufacturing Corp. However, the prior art does not disclose a standoff which enables two printed circuit boards to be stacked separated from the chassis and from one another where at least one of the printed circuit boards is to be mounted using a keyhole slot and keyhole.

BRIEF SUMMARY OF THE INVENTION

This application discloses a printed circuit board standoff which enables two or more printed circuit boards to be mounted in a stacked configuration on the chassis of an electronic instrument. The invention combines the advantages of the a keyhole mount printed circuit board standoff with an internally threaded standoff or friction snap lock standoff to enable a manufacturer to quickly and efficiently mount two printed circuit boards in a stacked configuration with a predetermined distance between the printed circuit boards and the chassis and between each other. Additionally, the one-piece standoff for mounting two or more boards eliminates the need for additional separate components thereby simplifying the manufacturing process and reducing the number of parts in inventory.

BRIEF DESCRIPTION OF THE DRAWINGS

Preferred embodiments of the invention are described below with reference to the following drawings.

FIG. 5 is a side view of a second embodiment of the present invention having a keyhole mount and a snap lock mount.

FIG. 6 is a top view of the snap lock keyhole mount standoff of FIG. 5.

FIG. 7 is a bottom view of the snap lock keyhole mount standoff of FIG. 5.

FIG. 8 is a perspective view of the snap lock keyhole mount standoff of FIG. 5.

DETAILED DESCRIPTION OF THE INVENTION

Figure 2:
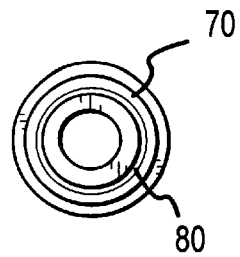
FIG. 2 is a top view of the internally threaded keyhole mount standoff of FIG. 1.
Figure 1:
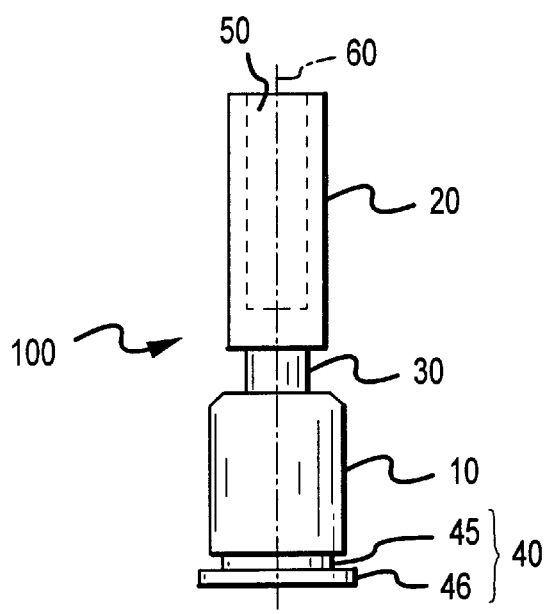
FIG. 1 is a side view of a first embodiment of the present invention having a keyhole mount and an internally threaded mount.
Figure 4:
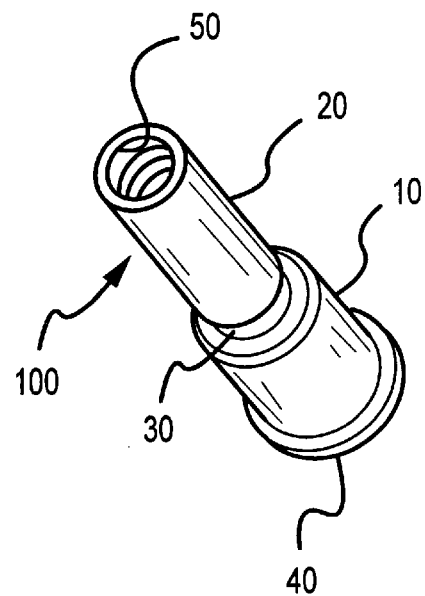
FIG. 4 is a perspective view of the internally threaded keyhole mount of FIG. 1.
Figure 3:
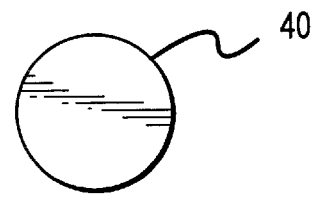
FIG. 3 is a bottom view of the internally threaded keyhole mount standoff of FIG. 1.

The printed circuit board (PCB) standoff of the present invention provides a means for stacking printed circuit boards in order to provide space between the printed circuit boards and a chassis as well as between printed circuit boards. One embodiment of the standoff according to the present invention is depicted in FIGS. 1–4. FIG. 1 provides a planar side view of one embodiment of the present invention. Bottom portion 10 of standoff 100 is affixed to the chassis of an electronic instrument through press-insertion feature 40 which has two elements. A first element 46 has slightly larger diameter than bottom portion 10 and a second element 45 has a slightly smaller diameter than bottom portion 10. Each of the press-insertion feature 40 elements 45 46 is of a thickness in the range of 0.015 to 0.05 inches, preferably 0.025 inches. It should be understood that there are many alternatives to the press-insertion feature 40 which could be used to affix the free end of the bottom portion 10 of standoff 100 to the chassis of an electronic instrument. For example, standoff 100 could be glued, welded, screwed, fastened or snap fit into place. Press-insertion feature 40 is only one of the many possible means to affix the standoff to the chassis.

The top portion 20 of standoff 100 is substantially cylindrical in cross section and has a top portion diameter 80 less than the bottom portion diameter 70 of the bottom portion 10 in order to enable a printed circuit board to slide down over top portion 20 to rest on the top of the bottom portion 10. Between bottom portion 10 and top portion 20 is a center portion 30 which has a smaller diameter than both the top portion 20 or bottom portion 10. This enables the key-hole slot formed in a printed circuit board to be lowered over and slid down top portion 20 and then be engaged in center portion 30 providing a support for the board spaced from the chassis of the electronic instrument. It is also important in this preferred embodiment that the diameter of the keyhole in the printed circuit board should be larger than top portion diameter 80 but less than bottom portion diameter 70 so that the keyhole can be slid down top portion 20 but will not travel past the top end of bottom portion 10. The small end of the keyhole should also have a width approximately equal to the diameter of center portion 30 so as to avoid any shifting of the board once the keyhole is engaged with center portion 30.

It is important to note that the top, center and bottom portions of standoff 100 need not be cylindrical, but rather could have any regular geometric form as a cross section, i.e., triangle, square, hexagon, pentagon, etc. The important limitation is that the effective diameter i.e., the diameter of the smallest circle in which the cross section of the portion will fit, of each portion is properly sized with respect to the other portions. The effective diameter of the bottom portion 10 should be greater than the effective diameter of the top portion 20 which should be greater than the effective diameter of the center portion 30, but it is not strictly necessary that the diameter of bottom portion 10 be greater than the diameter of top portion 20, however, such a configuration does facilitate the manufacturing process. It may also be necessary for the longitudinal axes of the portions to be aligned so as to facilitate use of the standoff during manufacture. It is also preferable for the standoff to have a regular geometric shape, such as a cylinder, so that special alignment during manufacture is not necessary.

In a preferred embodiment the substantially cylindrical bottom portion has a diameter of 0.230 inches, the substantially cylindrical center portion has a diameter of 0.100 inches and the substantially cylindrical top portion has a diameter of 0.166 inches. The length of the bottom portion is 0.338 inches, the length of the center portion 0.072 inches and the length of the top portion is 0.048 inches.

It is also possible that one or more of the elements be tapered, as long as the effective diameters are appropriately sized with respect to one another as described above.

The second printed circuit board is mounted on the top of the top portion 20 through the alignment of holes in the printed circuit board with the internally threaded shaft 50 which extends down into the top portion 20 of standoff 100. The internal threads may be either right handed or left handed and an appropriate pitch should be chosen to ensure a tight seating of the screw. The length of the internally threaded shaft should be sufficient to provide at least approximately three threads of engagement with the screw. The diameter of the shaft is preferably significantly smaller than the diameter of top portion 20 so as to ensure a mechanically sound support structure for the weight of the printed circuit board. Thus, the diameter may vary depending on the material used to make the standoff and also the cross sectional configuration of the top portion. In a preferred substantially cylindrical embodiment made of a machined metal the preferred diameter of the threaded shaft is approximately 0.100 inches.

A second embodiment of the present invention is depicted in FIGS. 5–8. FIG. 5 is a side view of the second embodiment of the present invention and depicts a snap lock standoff 200 which is similar to standoff 100 depicted in FIGS. 1–4 except for the use of the snap lock prongs 251, 252, 253 and 254 in place of the internally threaded shaft 50 as a means of affixing the top most printed circuit board. Thus the bottom portion 210, center portion 230 and bottom section of top portion 220 of the snap lock standoff 200 should be made according to the design principles described above for the first embodiment. As can be seen in FIGS. 5–8, it is possible that the diameter of bottom portion 210 is equal to the diameter of bottom section of top portion 220, although this is generally not preferred. The top section of top portion 220 comprises a plurality of prongs, four in the present embodiment 251, 252, 253, 254. It should be understood that a different number of prongs could be used along with various different prong geometries in order to provide a snap lock for the second printed circuit board. The following provides a description of only one embodiment of such a snap lock.

Prongs 251, 252, 253 and 254 are approximately 0.275 inches in length and each have an outward tapered portion 290, an inward tapered portion 280, a lock ring portion 270 and a shaft portion 260. The shaft portion 260 of each prong connects the tapered portions 280 and 290 and the lock ring portion 270 to the top potion 120 of the standoff 200. This enables a circuit board with holes pierced therethrough to be placed over the tapered portions 290 and pushed down over the lock ring portions 270 causing the prongs 251, 252, 253 and 254 to push in toward the longitudinal axis of standoff 200. After the circuit board is pushed over the lock ring portions 270 the prongs 251, 252, 253 and 254 snap back into position and the board is held in place by the underside of the lock ring portions 270. Thus, in this embodiment the prongs must be made of a material which has sufficient resiliency to function in this capacity. As described above with regard to the previous embodiment, the standoff 200 may be affixed to the chassis via press-insertion feature 240 or another method such as gluing, welding, screwing, bolting or through a snap lock fixture.

The material used to manufacture the standoff may be metal or a plastic polymer such as polypropylene, nylon, etc. Any material which has sufficient strength to support a printed circuit board and which can be machined or molded to include either internal threads or the snap lock configuration may be used to manufacture the standoff.

Figure 9:
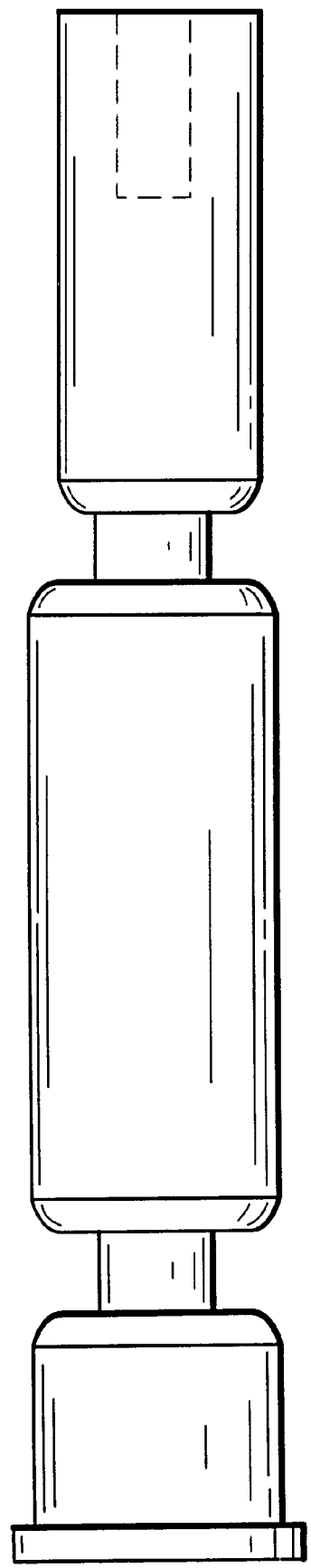
FIG. 9 is a side view of a standoff for holding a plurality of circuit boards and having a screw mounted top board.

Other embodiments of the invention described herein would include the use of a threaded rod and nut, an adhesive, a rivet or a clamp to affix the second printed circuit board to the top of the standoff. Additionally it would be possible to create standoffs for more than two printed circuit boards by taking the teaching of the specification and adding intermediate keyhole seats to accommodate different sized keyholes. As long as the printed circuit boards each have a keyhole cutout adapted to fit over the top most portion and all intervening keyhole seats the number of printed circuit boards stacked may be increased until the limit of the structural integrity of the material used for the standoff is reached. Additionally, the diameters of the various portions of the standoff may be made so that the largest effective diameters are at the bottom of the standoff, i.e., the diameter of the bottom-most bottom portion would be greater than the diameter of the next bottom portion which would be greater than the diameter of the next bottom portion, if any. The top portion of the bottom-most keyhole cutout seat would then function as the bottom portion of the next keyhole cutout seat in a telescoping manner. FIG. 9 depicts one embodiment of such a standoff for mounting three printed circuit boards on a chassis. Although such a telescopic arrangement creates a multi-tiered standoff which is easier to use during manufacture it is not necessary to make the subsequent top and bottom portions smaller in diameter. All top and bottom portions may be of identical diameter as long as there is a center portion of smaller diameter to act as the key-hole seat.

While various embodiments of the present invention have been described in detail, it is apparent that modifications and adaptations of those embodiments will occur to those skilled in the art. For example, it should be appreciated that the method and apparatus as taught by the present invention may be modified in an unlimited number of ways within the framework of the teachings of the present invention. These variations are all considered to fall within the scope of the present invention provided only that the false charge reduction concepts as taught herein are applied. Therefore, it is to be expressly understood that such modifications and adaptations are within the spirit and scope of the present invention, as set forth in the following claims.

I claim:

1. A single-piece standoff for mounting a plurality of electronics boards on a chassis comprising:

a bottom portion having a first end and a second end and having a first effective diameter; said first end of said bottom portion adapted to be affixed to the chassis, a top portion having a first end and a second end and having a second effective diameter less than or equal to said first effective diameter;

a center portion between said second end of said bottom portion and said first end of said top portion for engaging a first circuit board mounted on said bottom portion, said center portion having a third effective diameter less than said second effective diameter;

a means for mounting a second circuit board on said second end of said top portion, wherein said single-piece standoff supportably engages both said first and said second circuit boards thereupon to mount said first and second circuit boards to said chassis.

2. A standoff for mounting a plurality of electronics boards on a chassis comprising:

a bottom portion having a first end and a second end and having a first effective diameter; said said first end of said bottom portion adapted to be affixed to the chassis, a top portion having a first end and a second end and having a second effective diameter less than or equal to said first effective diameter;

a center portion between said second end of said bottom portion and said first end of said top portion for engaging a first circuit board mounted on said bottom portion, said center portion having a third effective diameter less than said second effective diameter;

a means for mounting a second circuit board on said second end of said top portion, wherein said standoff supportably engages both said first and said second circuit boards to said chassis, and wherein the means for mounting said second board comprises a portion of said top portion having an internally threaded shaft extending into said second end of said top portion and substantially coaxial with said top portion, wherein said standoff is of a single piece construction that defines each of said bottom portion, top portion, center portion and means for mounting thereof.

3. A standoff for mounting a plurality of electronics boards on a chassis comprising:

bottom portion having a first end and a second end and having a first effective diameter; said said first end of said bottom portion adapted to be affixed to the chassis, a top portion having a first end and a second end and having a second effective diameter less than or equal to said first effective diameter;

a center portion between said second end of said bottom portion and said first end of said top portion for engaging a first circuit board mounted on said bottom portion, said center portion having a third effective diameter less than said second effective diameter;

a means for mounting a second circuit board on said second end of said top portion, wherein said standoff supportably engages both said first and said second circuit boards to said chassis, and wherein the means for mounting said second board comprises a plurality of flexible prongs each having a first end and a second end wherein each of the plurality of prongs is attached at said first end to said second end of said top portion and extends longitudinally therefrom, each of the plurality of prongs having a lock ring portion, wherein said standoff is of a single piece construction that defines each of said bottom portion, top portion, center portion and means for mounting thereof.

4. The standoff of claim 3 wherein each of the plurality of prongs further comprises an outwardly tapered first portion and an inwardly tapered second portion located at said first end and ending at said lock ring portion.

* * * * *